US012604739B2

(12) United States Patent (10) Patent No.: US 12,604,739 B2

Lee et al. (45) Date of Patent: Apr. 14, 2026

(54) SEMICONDUCTOR DEVICE AND METHOD OF FORMING A 3-D STACKED SEMICONDUCTOR PACKAGE STRUCTURE

(71) Applicant: JCET STATS ChipPAC Korea Limited, Incheon (KR)

(72) Inventors: SeungHyun Lee, Incheon (KR); YeJin Park, Incheon (KR); HeeSoo Lee, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 485 days.

(21) Appl. No.: 18/188,844

(22) Filed: Mar. 23, 2023

(65) Prior Publication Data

US 2024/0321783 A1 Sep. 26, 2024

(51) Int. Cl.
| | |
|---|---|
| *H01L 23/66* | (2006.01) |
| *H10W 42/20* | (2026.01) |
| *H10W 44/20* | (2026.01) |
| *H10W 74/01* | (2026.01) |
| *H10W 74/10* | (2026.01) |
| *H10W 72/29* | (2026.01) |
| *H10W 72/90* | (2026.01) |
| *H10W 90/00* | (2026.01) |

(52) U.S. Cl.
CPC .......... *H10W 44/20* (2026.01); *H10W 42/20* (2026.01); *H10W 74/016* (2026.01); *H10W 74/117* (2026.01); *H10W 44/248* (2026.01);

*H10W 72/29* (2026.01); *H10W 72/9413* (2026.01); *H10W 72/952* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 11,610,847 | B2 * | 3/2023 | Kim | ......................... H01L 23/66 |
| 11,908,781 | B2 * | 2/2024 | Cho | ..................... H01L 23/5389 |
| 2019/0051989 | A1 | 2/2019 | Kim et al. | |
| 2021/0366838 | A1 | 11/2021 | Han et al. | |
| 2022/0246533 | A1 | 8/2022 | Cho et al. | |
| 2022/0359418 | A1 * | 11/2022 | Jung | ....................... H01L 25/03 |
| 2022/0359420 | A1 * | 11/2022 | Kim | ..................... H01L 23/552 |

* cited by examiner

*Primary Examiner* — Long Pham

(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and a first electrical component disposed over the substrate. An encapsulant is deposited over the first electrical component. A shielding layer is formed over the encapsulant. The shielding layer is patterned to form a conductive trace and a contact pad. A board-to-board (B2B) connector is disposed over the encapsulant and electrically coupled to the substrate by the conductive trace.

22 Claims, 17 Drawing Sheets

SEMICONDUCTOR DEVICE AND METHOD OF FORMING A 3-D STACKED SEMICONDUCTOR PACKAGE STRUCTURE

FIELD OF THE INVENTION

The present invention relates in general to semiconductor devices and, more particularly, to a semiconductor device and method of forming a stacked three-dimensional semiconductor package structure.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices may contain multiple electrical components, e.g., multiple semiconductor die and myriad discrete components to support the semiconductor die, disposed on one or more substrates to perform necessary electrical functions. Such a package is commonly referred to as a system-in-package (SiP) module. SiP modules and other semiconductor packages that include one or more antennae for transmitting and receiving electromagnetic signals are commonly called antennae-in-package (AiP) modules.

A common concern for SiP modules, AiP modules, and other types of packages is how to fit more electrical components within the same footprint size. Stacking components over each other is a common strategy, but forming electrical interconnects between the stacked components becomes a limiting factor. Stacking in a component-dense and highly integrated package is a challenge. Therefore, a need exists for improvements in stacked three-dimensional (3-D) semiconductor package structures.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
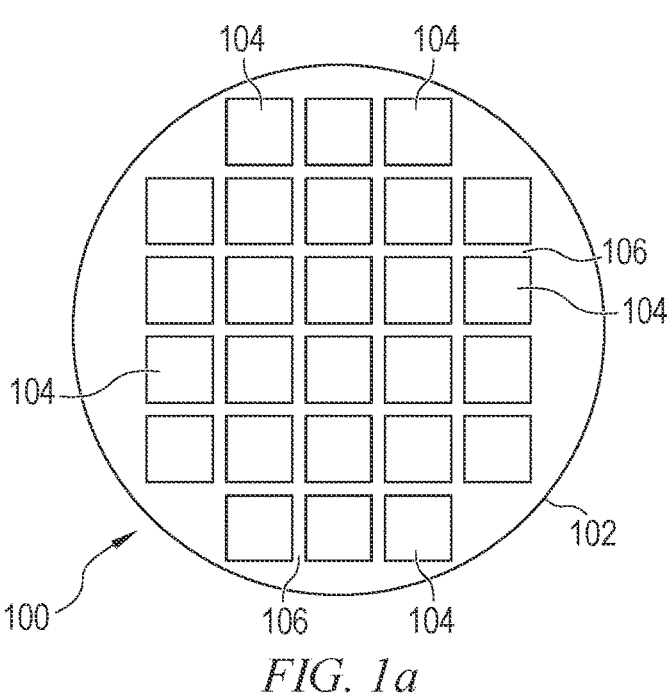
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
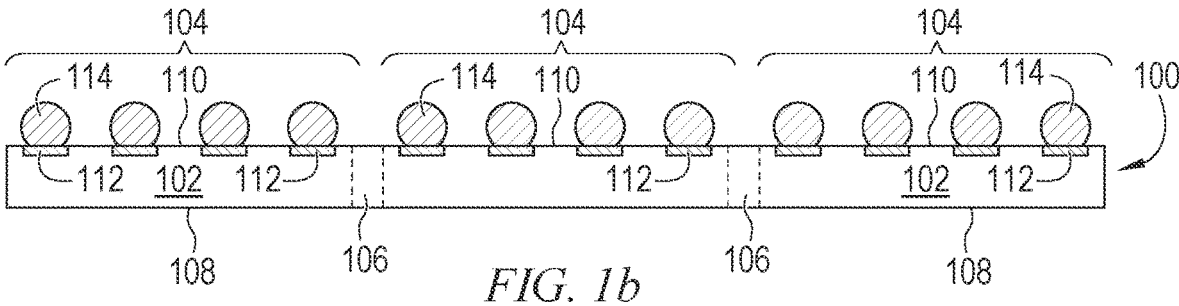

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under-bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
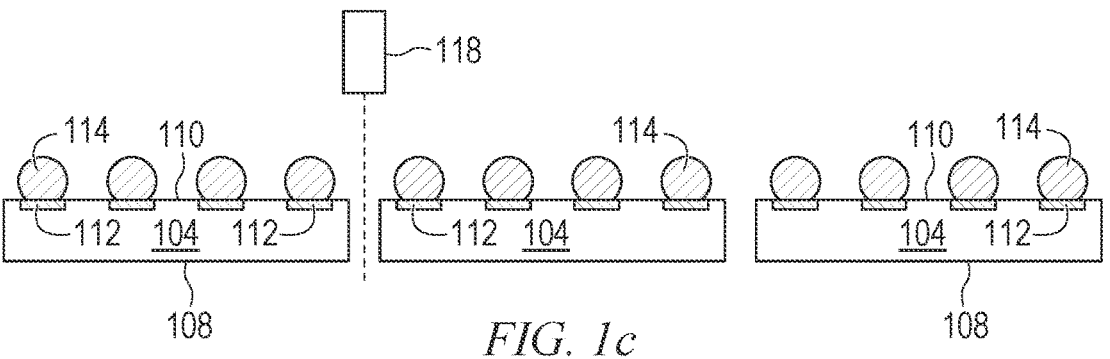

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C:
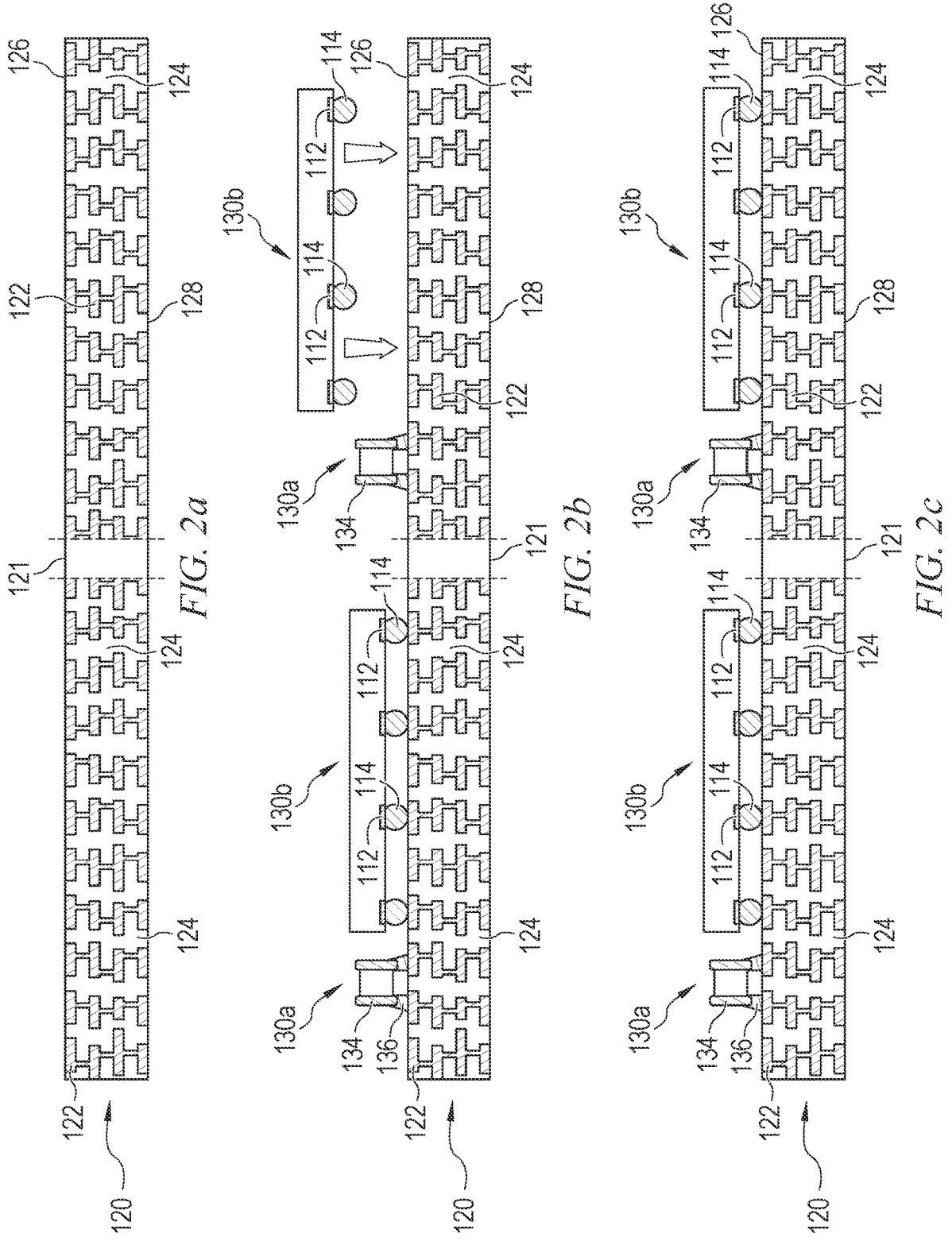
FIGS. 2a-2r illustrate forming a 3-D stacked semiconductor package.
Figures 2D, 2E:
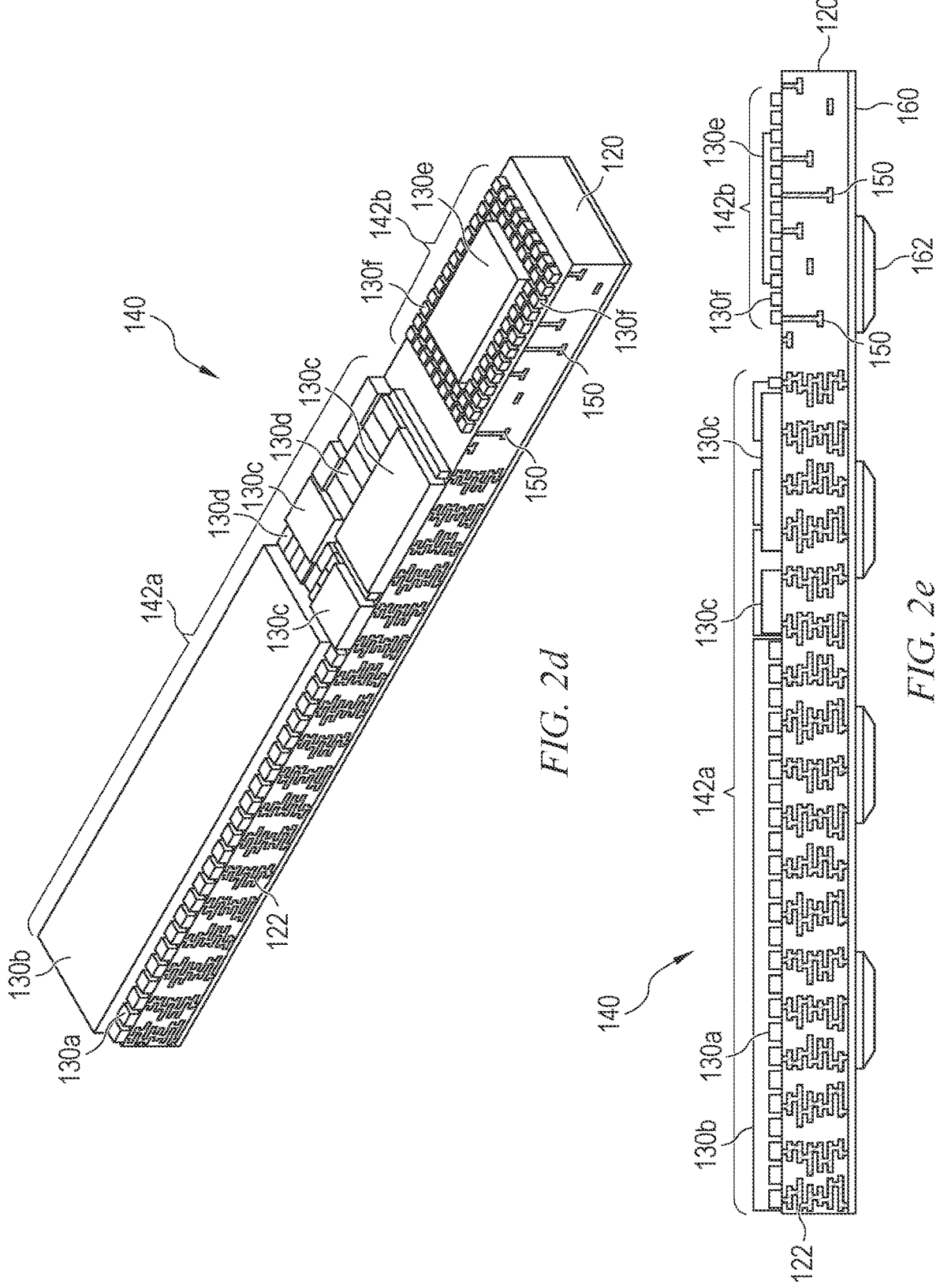
Figures 2F, 2G:
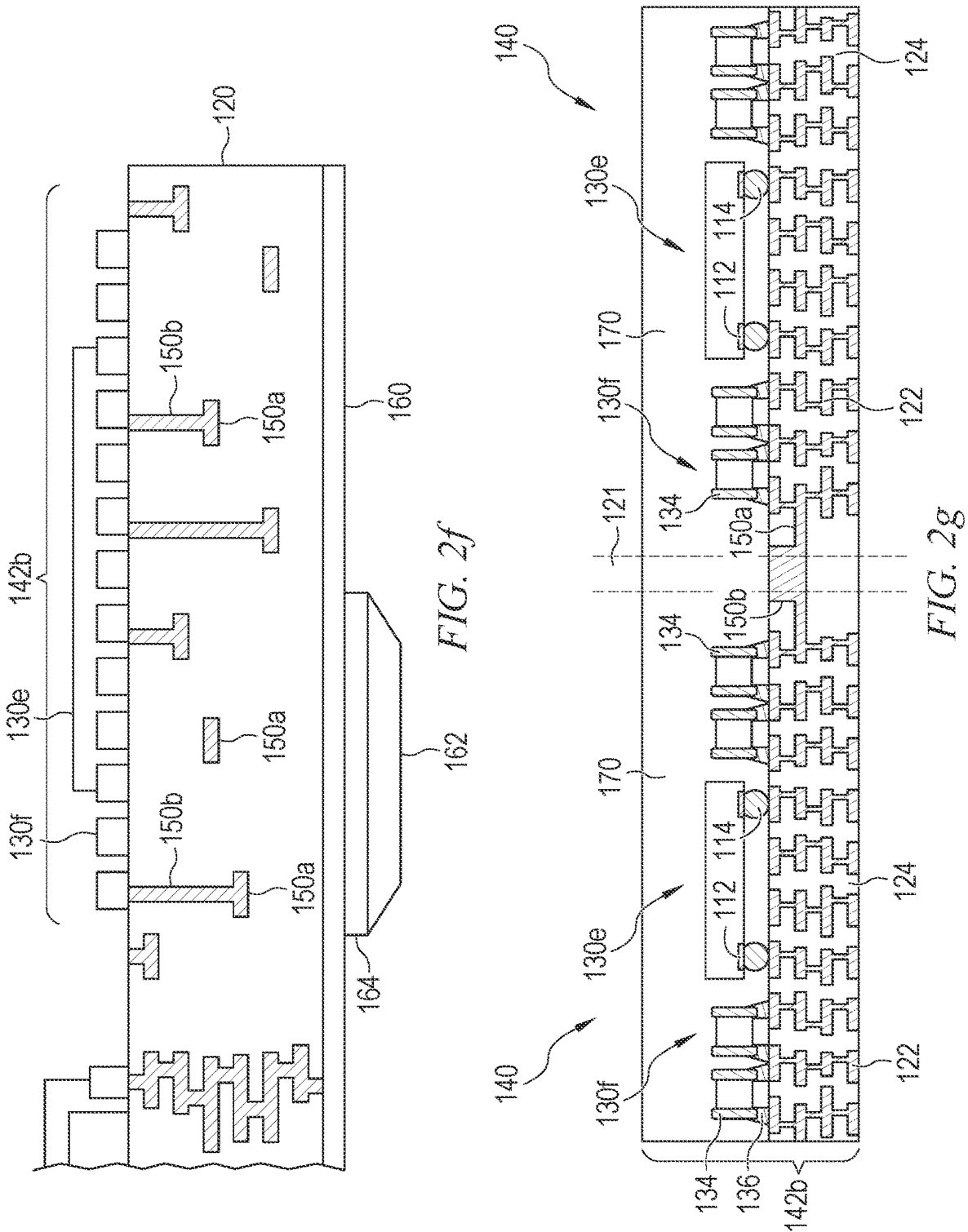
Figures 2H, 2I:
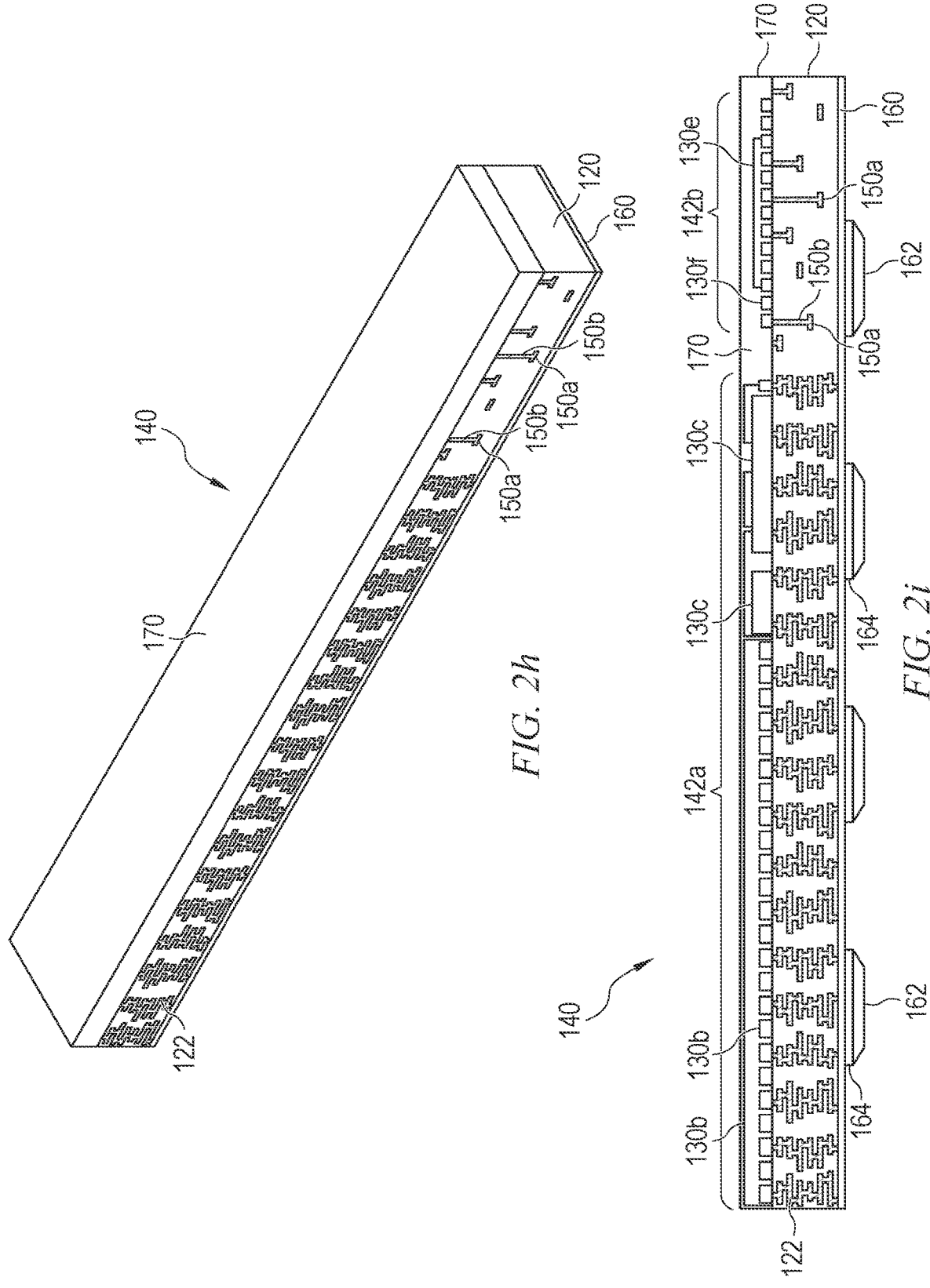
Figures 2J, 2K:
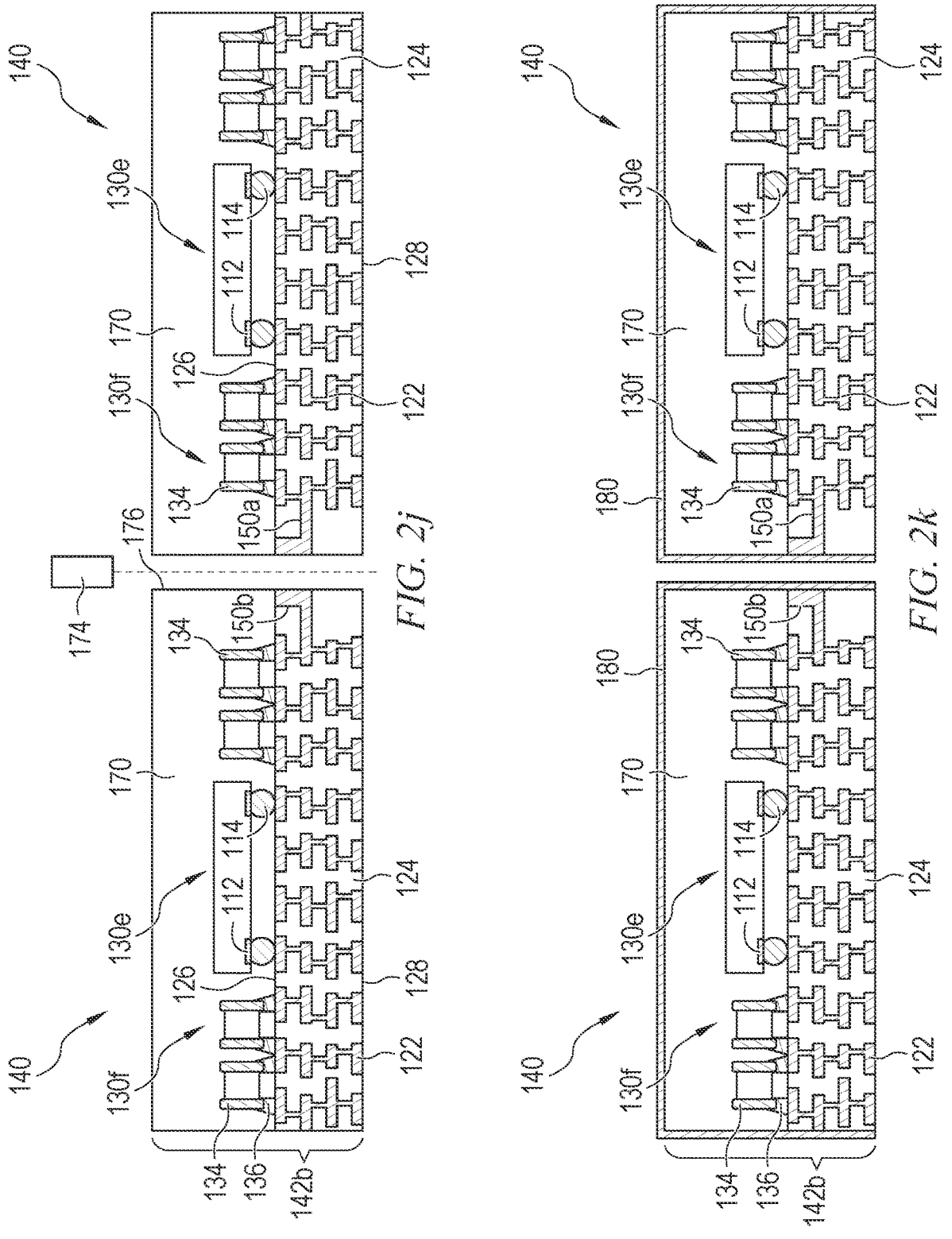
Figure 21:
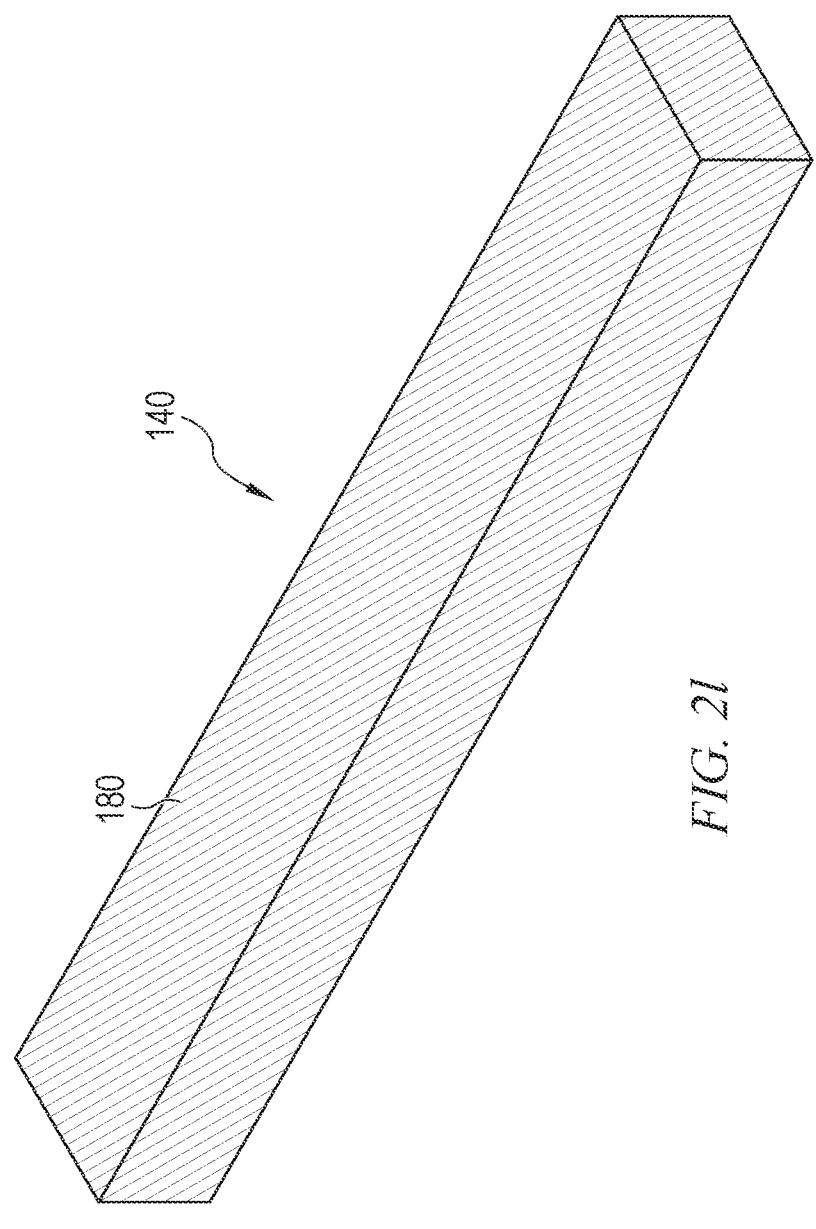
Figure 2M:
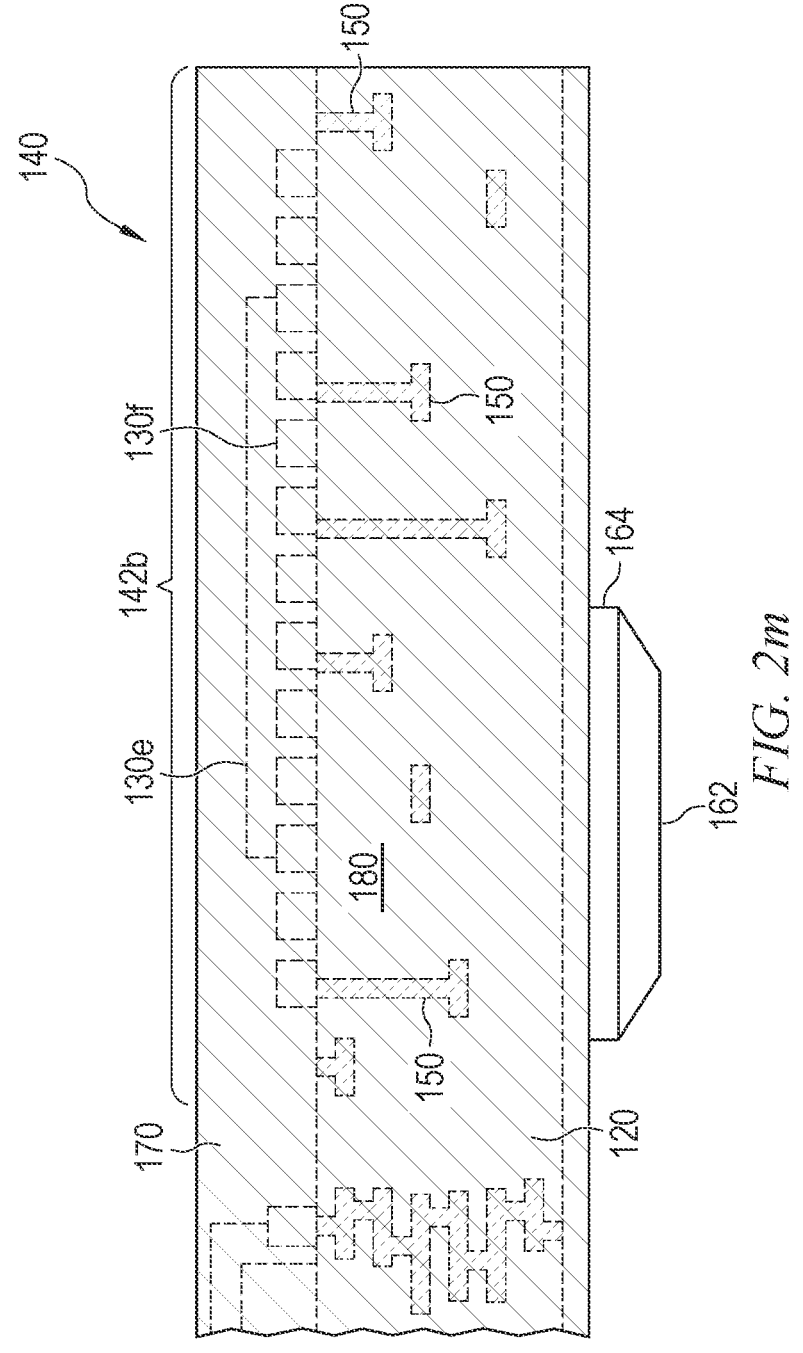
Figure 2N:
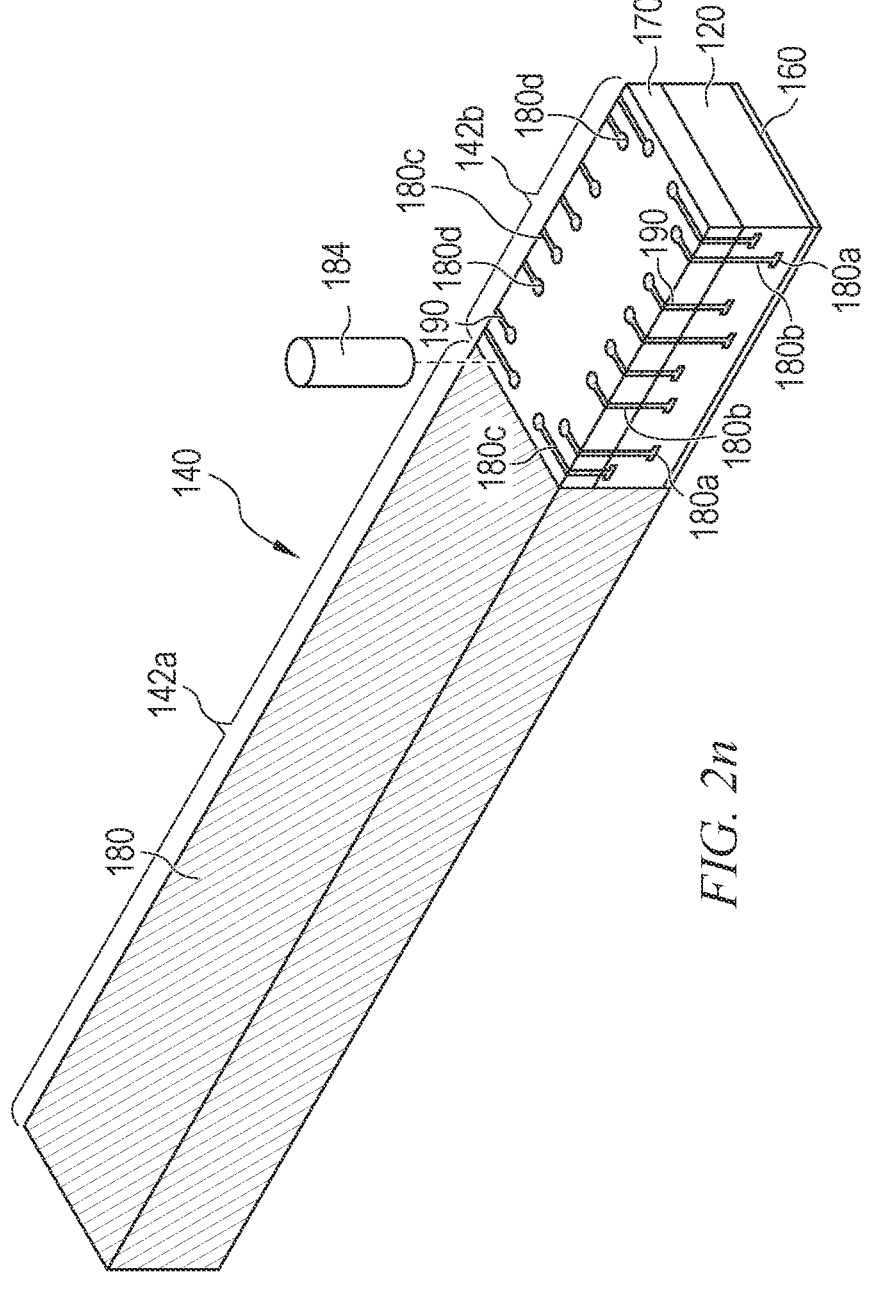
Figures 2O, 2P:
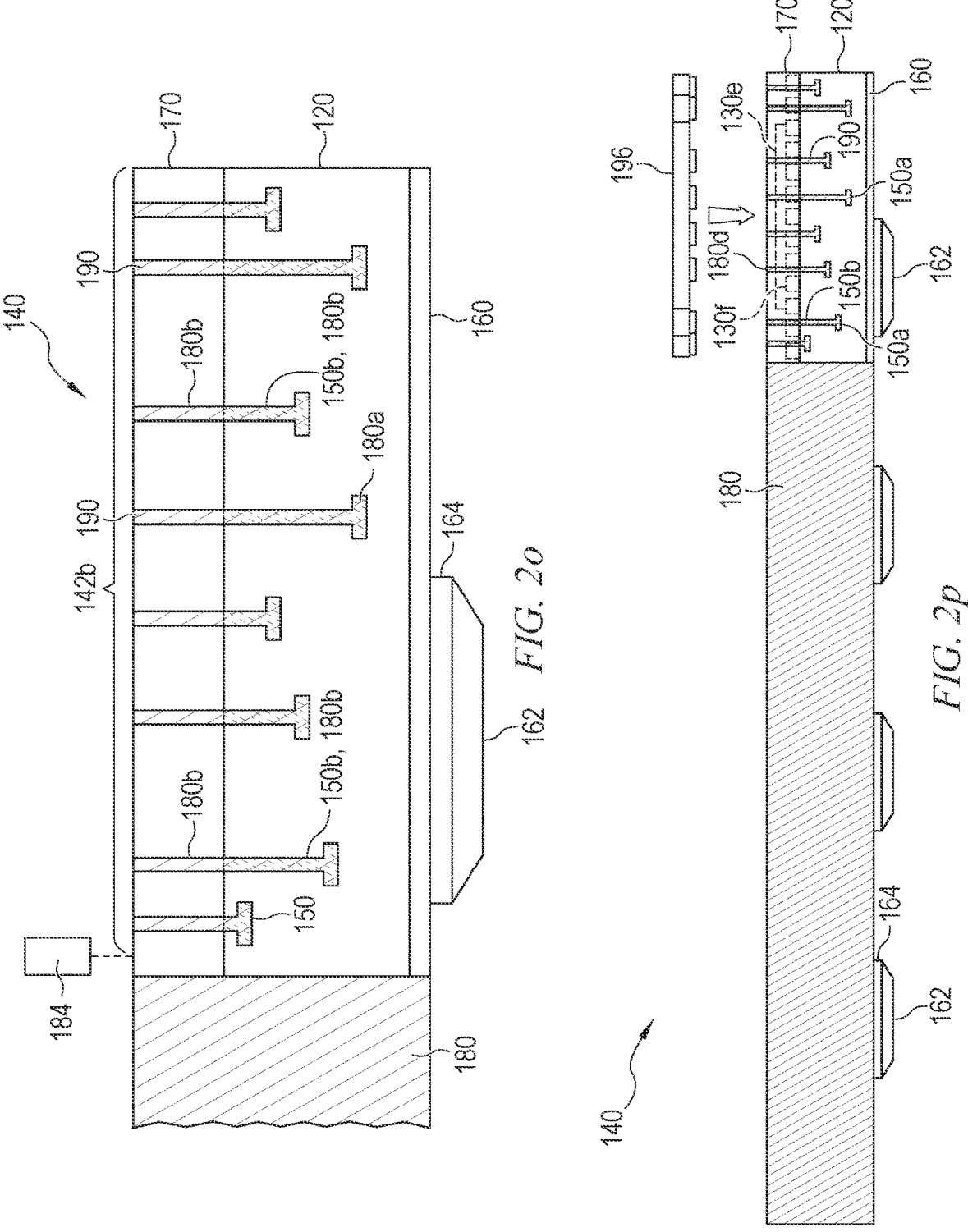
Figures 2Q, 2R:
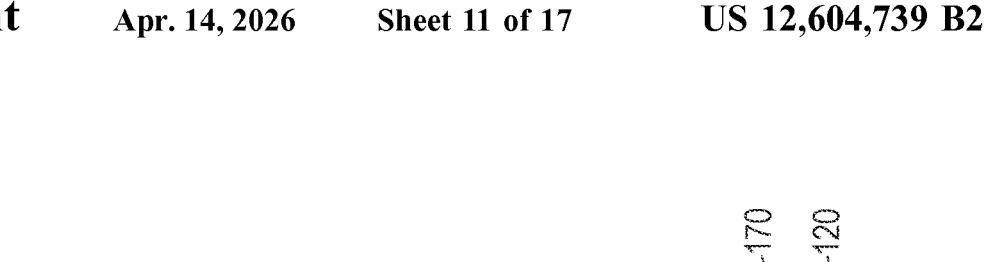

FIGS. 2a-2r illustrate a process of forming a 3-D stacked semiconductor package. FIG. 2a shows a cross-sectional view of multi-layered interconnect substrate 120 including conductive layers 122 and insulating layers 124. While only a single substrate 120 suitable to form two semiconductor packages separated by saw street 121 is shown, hundreds or thousands of units are commonly manufactured and processed as part of a single substrate before being singulated from each other, using the same steps described herein performed en masse. A separate substrate 120 could also be used for each unit being manufactured, the substrate being singulated before the steps shown in FIGS. 2a-2c and a plurality of individual substrates being placed on a common carrier for processing.

Conductive layers 122 can be one or more layers of Al, Cu, Sn, Ni, Au, Ag, or other suitable electrically conductive material. Conductive layers 122 can be formed using PVD, CVD, electrolytic plating, electroless plating, or other suitable metal deposition process. Conductive layers 122 provide horizontal electrical interconnect across substrate 120 and vertical electrical interconnect between top surface 126, bottom surface 128, and intermediate conductive layers. Portions of conductive layers 122 can be electrically common or electrically isolated depending on the design and function of the package being formed. In some embodiments where an AiP module is being formed, conductive layers 122 are patterned to form an antenna within or on substrate 120.

Insulating layers 124 contain one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers 124 can be formed using PVD, CVD, printing, lamination, spin coating, spray coating, sintering, thermal oxidation, or another suitable process. Insulating layers 124 provide isolation between conductive layers 122. Any number of conductive layers 122 and insulating layers 124 can be interleaved over each other to form substrate 120. Any other suitable type of package substrate or leadframe is used for substrate 120 in other embodiments.

In FIG. 2b, electrical components 130a, 130b, and any other desired electrical components are disposed on top surface 126 of substrate 120 and electrically and mechanically connected to conductive layers 122. Electrical components 130 are positioned over substrate 120 using a pick-and-place operation. For example, electrical components 130a can be discrete electrical devices, such as diodes, transistors, resistors, capacitors, and inductors. Electrical components 130b can be, or be made similar to, semiconductor die 104 from FIG. 1c with bumps 114 oriented toward surface 126 of substrate 120. Alternatively, electrical components 130 can include any other desired semiconductor die, semiconductor packages, surface mount devices, RF components, or discrete electrical devices. Any of the electrical components 130 can also have integrated passive devices (IPDs) formed thereon.

Electrical components 130 are brought into contact with a conductive layer 122 on surface 126 of substrate 120. Terminals 134 of electrical components 130a are electrically and mechanically connected to conductive layer 122 using solder or conductive paste 136. Electrical components 130b are electrically and mechanically connected to conductive layer 122 by reflowing bumps 114. FIG. 2c illustrates electrical components 130 electrically and mechanically connected to conductive layers 122 of substrate 120. Any desired combination of electrical components of any suitable type can be used to form a semiconductor package on substrate 120. Electrical components can also be disposed over bottom surface 128 or within the layers of substrate 120.

FIG. 2d shows a wider perspective view of a semiconductor package 140 being formed with electrical components 130c, 130d, 130e, and 130f disposed on substrate 120 in addition to the components 130a and 130b shown in FIGS. 2b and 2c. Semiconductor package 140 is a system-in-package or antenna-in-package module in some embodiments. FIG. 2e shows another cross-sectional view with electrical components 130a-130f. Formation of semiconductor package 140 will be discussed in terms of two separate areas of the package: shielded area 142a and interconnect area 142b. FIG. 2f shows a detailed cross-sectional view of interconnect area 142b.

Electrical components 130a-130d are disposed within shielded area 142a. Electrical components 130e and 130f are disposed within interconnect area 142b. Electrical components 130c and 130e are semiconductor die formed similar to semiconductor die 104. Electrical components 130d and 130f are discrete active or passive components similar to components 130a. Any combination of suitable electrical components can be disposed at any desired location over, under, or within substrate 120.

Portions of conductive layers 122 remain exposed at the side of substrate 120 for each package 140. Within shielded area 142a, exposed conductive layers 122 provide grounding for a shielding layer to be formed at a later step. Within interconnect area 142b, the exposed portions of conductive layers 122 are used to form interconnect structures 150. Shielded area 142a will ultimately have a shielding layer formed over the top and sides thereof, so the layout of electrical components 130 should include components where shielding is desired within the shielded area. The shielding layer within interconnect area 142b will ultimately be patterned to form interconnect structures.

Interconnect structures 150 optionally have both a horizontal component 150a and a vertical component 150b. Each horizontal component 150a is a portion of a horizontally oriented conductive layer that extends to a side surface of substrate 120 for each package 140. Each vertically oriented portion 150b is a stack of vertically oriented conductive vias of conductive layers 122 and portions of horizontally oriented conductive layers in between the vias. Each vertically oriented portion 150b extends from a corresponding horizontal portion 150a to top surface 126 of substrate 120. In other embodiments, vertically oriented portions 150b do not extend completely to top surface 126. Interconnects 150 can be formed with only vertical portion 150b, only horizontal portions 150a, or both combined. Horizontal portions 150a can be simply conductive traces of conductive layers 122 that are exposed, or larger contact pads can be formed to increase electrical contact area. Horizontal portions 150a can be formed in the middle of vertical portions 150b in addition to or instead of at the bottom of the vertical portions. Interconnect structures 150 can be exposed at the end of substrate 120 in addition to the sides as illustrated. The end of substrate 120 is oriented to the bottom-right in FIG. 2d.

Conductive layers 122 are formed into interconnect structures 150 during build-up of the multiple layers of substrate 120. In other embodiments, vertically oriented portions 150b are formed by drilling into substrate 120 using a mechanical drill, chemical etching, or laser drilling after the stack of conductive layers 122 and insulating layers 124 is complete. The resulting hole is completely or partially filled with conductive material to form vertically oriented portions 150b. The conductive material for vertical oriented portions 150b is solder or solder paste in one embodiment.

A passivation layer 160 is optionally formed on bottom surface 128 of substrate 120. Passivation layer 160 can be formed of the same material and in the same process as insulating layers 124, or any other suitable process and material. Blocks 162 are optionally formed or attached onto the bottom of substrate 120, either directly onto bottom surface 128 or on passivation layer 160 if used. Blocks 162 are formed using any suitable method and material, typically a molded polymer material. Blocks 162 are molded directly onto the bottom of substrate 120 in one embodiment. In other embodiments, blocks 162 are attached to substrate 120 using an adhesive 164. In one embodiment, block 162 are specifically formed over the bottoms of antennae within substrate 120 to help the antennae transmit or receives electromagnetic signals. Blocks 162 may be formed of a high dielectric constant encapsulant to improve antennae performance.

In FIGS. 2g-2i, encapsulant or molding compound 170 is deposited over and around electrical components 130a-130e and substrate 120 using a paste printing, compressive molding, transfer molding, liquid encapsulant molding, vacuum lamination, spin coating, or another suitable applicator. FIG. 2g shows a cross-sectional view through interconnect area 142b, FIG. 2h shows a perspective view of package 140, and FIG. 2i shows a side view of package 140. Encapsulant 170 can be liquid or granular polymer composite material, such as epoxy resin, epoxy acrylate, or polymer, with or without a filler. Encapsulant 170 is non-conductive, provides structural support, and environmentally protects the semiconductor device from external elements and contaminants.

FIG. 2g is a cross-section through interconnect area 142b showing how vertical portions 150b of two adjacent packages 140 are optionally formed as a single conductive via. In most embodiments, substrate 120 and encapsulant 170 form a panel of semiconductor packages 140 with electrical components 130. In FIG. 2j, the panel is singulated using saw blade or laser cutting tool 174 into individual semiconductor packages 140. The singulation exposes side surfaces 176 of each semiconductor package 140, including interconnect structures 150 on both or all three external sides of interconnect area 142b of each package 140. Singulation can occur at any stage of manufacturing.

In FIG. 2k, shielding layer 180 is deposited, printed, sputtered, plated, or otherwise formed over semiconductor packages 140. FIG. 2l shows an external perspective view with a package 140 completely covered by shielding layer 180. FIG. 2m shows a close-up view of interconnect area 142b from the side, with elements under shielding layer 180 drawn in dashed lines. Shielding layer 180 completely covers the top and all side surfaces of encapsulant 170 and all of the side surfaces of substrate 120, including the exposed interconnect structures 150 formed as part of conductive layers 122. Shielding layer 180 is formed directly on and physically contacting interconnect structures 150.

In FIGS. 2n and 2o, portions of shielding layer 180 are removed within interconnect area 142b to leave portions 180a-180d of the shielding layer as interconnect structures 190. FIG. 2n is a perspective view of the entire package 140 while FIG. 2o is a detailed side view of interconnect area 142b. Interconnect structures 190 include a portion 180a formed on the underlying horizontal portion 150a of interconnect structure 150 and a portion 180b formed on the underlying vertical portion 150b, both formed on side surfaces 176 of package 140. Portions 180a and 180b are formed to match the size and shape of underlying interconnect structures 150, with the addition that the vertical portions 180b extend completely up to the top of encapsulant 170 rather than stopping at the top surface of substrate 120. In another embodiment, portions 180a and 180b are formed larger than their respective underlying portions 150a and 150b to ensure proper alignment and electrical contact. Portion 180c and contact pad 180d are left on the top surface of encapsulant 170 to operate as horizontally oriented conductive traces and contact pads. Interconnect structures 190 are formed down the end surface of package 140 in addition to the side surfaces in some embodiments. The end surface of package 140 is oriented toward the bottom-right in FIG. 2n.

Portions 180b and 180c of interconnect structures 190 operate as vertical and horizontally oriented conductive traces, respectively, providing an electrical connection between interconnect structures 150 of conductive layers 122 and contact pad 180d, which operates as a contact pad on the top surface of encapsulant 170. Portions 180b and 180c in combination are a conductive trace electrically coupling contact pad 180d to interconnect structure 150 of substrate 120. Contact pads 180d allow mounting of any desired electrical components on the top surface of package 140. While a B2B connector is illustrated below, any electrical component, such as any mentioned above for use as electrical components 130, can be mounted onto contact pads 180d in addition to or instead of the B2B connector.

Interconnect structures 190, interconnect structures 150, and conductive layers 122 connect the electrical components mounted to contact pads 180d to the underlying electrical components 130 within encapsulant 170. Interconnect structures 190 are formed from portions 180a-180d of shielding layer 180 that remain after laser ablation removes the surrounding portions of the shielding layer. Each interconnect structure 190 is formed directly on an exposed interconnect structure 150. Shielding layer 180 remains surrounding electrical components within shielded area 142a of package 140 while the shielding layer is patterned within interconnect area 142b to form interconnect structures 190.

In FIG. 2p, a board-to-board (B2B) connector 196 is mounted onto contact pads 180d. FIGS. 2q and 2r show B2B connector 196 installed. FIG. 2q is a perspective view of a completed package 140 and FIG. 2r is a side view. B2B connector 196 is electrically and physically connected to contact pads 180d using solder bumps or solder paste in a similar manner to how electrical components 130 are mounted to substrate 120. B2B connector 196 allows an interconnect structure with a corresponding connector to snap into the B2B connector and thereby electrically connect another package or device to electronic components 130 of semiconductor package 140. B2B connector 196 is electrically connected to electrical components 130 via interconnect structures 190, interconnect structures 150, and conductive layers 122. Shielding layer 180 is patterned to form horizontal and vertical interconnects over the surface of package 140 in interconnect area 142b in addition to providing shielding around shielded area 142a B2B connector 196 is disposed over encapsulant 170, rather than directly on substrate 120 as is typically the case in the prior art. Disposing B2B connector 196 on encapsulant 170 allows additional electrical components 130e and 130f to be disposed on substrate 120 under the B2B connector. Without interconnect structures 150 and 190 allowing a connection to B2B connector 196 on the top of encapsulant 170, electrical components 130e and 130f would need to be placed elsewhere on a substrate 120 with a larger footprint. Even placing B2B connector 196 over components 130e and 130f in the prior art, while possible, would require a larger footprint for substrate 120 to accommodate the required vertical interconnect structures. Interconnect structures 190 allow vertical and horizontal interconnect using the same shielding layer 180 that is typically formed anyway as an EMI shield for components 130. Shielding layer 180 lies flat on the external surfaces of semiconductor package 140, so patterning interconnect structures 190 from the shielding layer does not increase the footprint of the package. Forming interconnect structures 190 from shielding layer 180 allows a smaller form-factor device with reduced manufacturing costs.

Figures 3A, 3B:
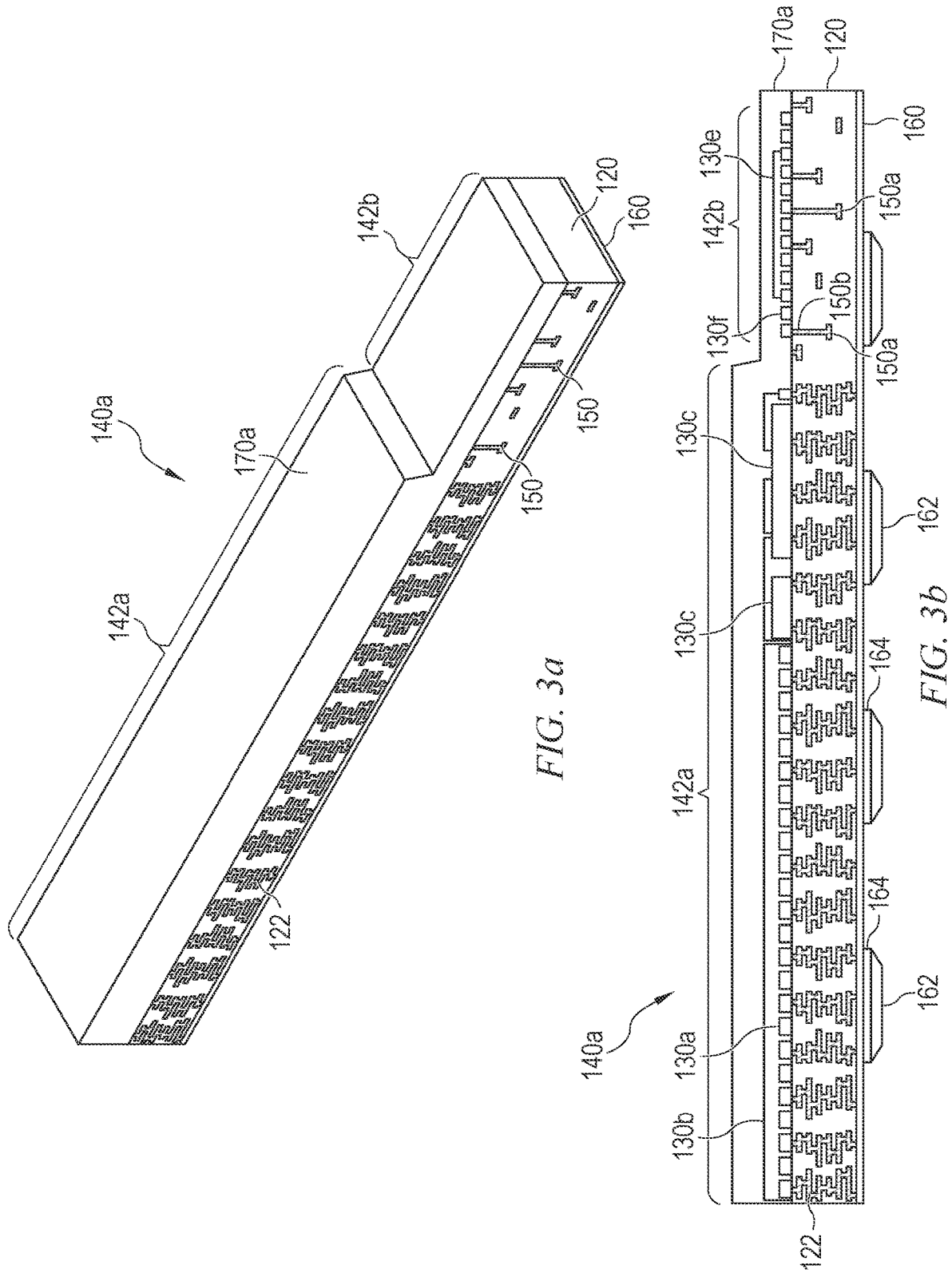
FIGS. 3a-3d illustrate an embodiment with stepped thickness.

Package 140 includes a B2B connector that sticks out over the top surface of encapsulant 170. FIGS. 3a-3d show forming semiconductor package 140a with encapsulant 170a molded to have a first thickness in shielded area 142a that is thicker than a second thickness of the encapsulant in interconnect area 142b. FIGS. 3a and 3b show encapsulant 170a molded over substrate 120. Encapsulant 170a has a first uniform thickness within shielded area 142a and a second uniform thickness within interconnect area 142b, such that the encapsulant has a flat upper surface within both areas. A sloped surface connects the top surface of encapsulant 170a within shielded area 142a and the top surface of the encapsulant within interconnect area 142b. Encapsulant 170a is deposited in the same manner as disclosed above for encapsulant 170 but molded in a different shape. The steps disclosed above prior to depositing encapsulant 170 remain the same when encapsulant 170a is used.

Figures 3C, 3D:
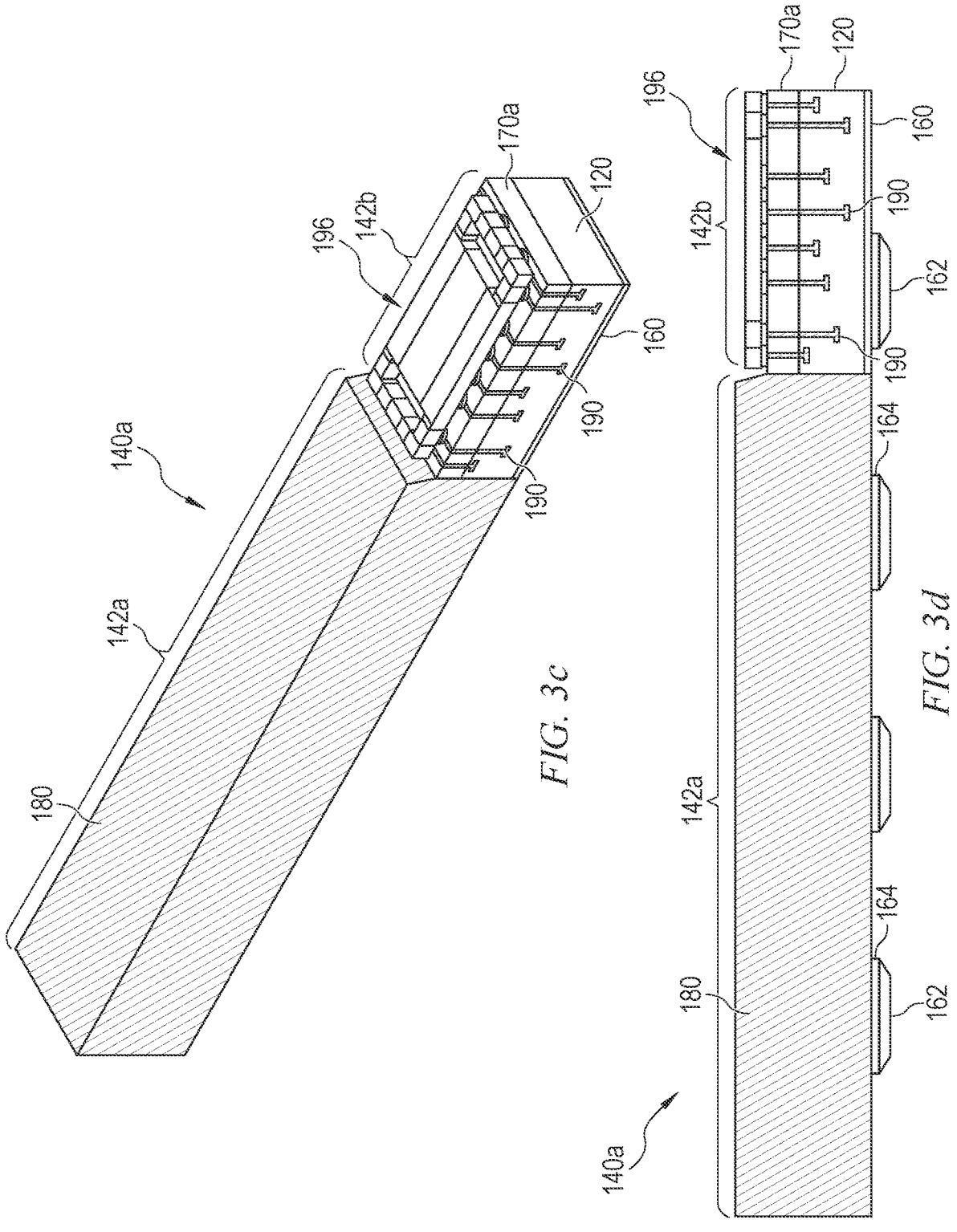

FIGS. 3c and 3d show a completed package 140a with step-molded encapsulant 170a and shielding layer 180 formed over shielded area 142a. B2B connector 196 is disposed over the lower step of the molding and electrically connected to conductive layers 122 of substrate 120 through interconnect structures 190, which are deposited as part of shielding layer 180 and then patterned by laser ablation. The thicker portion of encapsulant 170a extends to a higher level over substrate 120 than the top of B2B connector 196. Stepped encapsulant 170a protects B2B connector 196 by not having the B2B connector physically extend above the rest of the package.

The thicker portion of encapsulant 170a in shielded area 142a allows taller components to be used compared to the uniform-thickness encapsulant 170 in package 140. Alternatively, encapsulant 170a can have the same thickness in shielded area 142a as encapsulant 170, while the stepped encapsulant 170a has a reduced thickness in interconnect area 142b. Such a configuration reduces the overall sizes of the package while still allowing all the same electrical components, including electrical components 130e and 130f under B2B connector 196. Package 140a has a lower profile and reduced cost to make the pattern compared to package 140.

Shielding layer 180 is illustrated as a single metal layer deposited over semiconductor package 140 above. However, in most real-world cases shielding layers are formed as multiple layers. One common option is to deposit a stainless steel adhesion layer first, then a copper shielding layer, and then a stainless steel protection layer. For interconnect structures 190, it may be desirable in some embodiments to use the three-layer shielding layer concept within shielded layer 142a but to use a lower number of layers to form conductive traces and contact pads for interconnect structures 190.

Figures 4A, 4B:
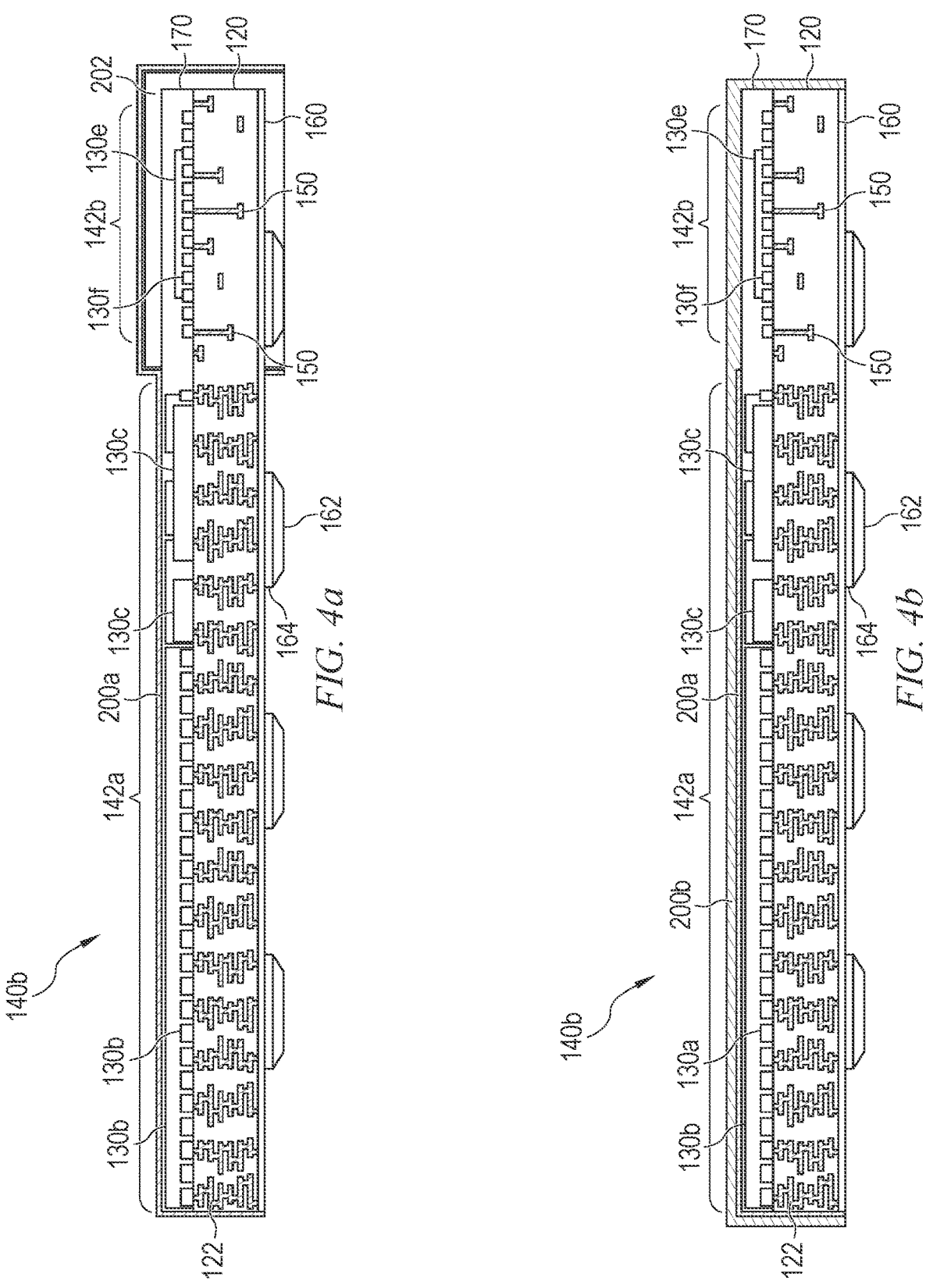
FIGS. 4a-4d illustrate an embodiment with a multi-layered shielding layer.

FIGS. 4a-4d illustrate semiconductor package 140b, an embodiment where shielding layer 180 is formed as three layers: adhesion layer 200a, shielding layer 200b, and protection layer 200c. In FIG. 4a, a mask 202 is disposed over interconnect area 142b, using a pick-and-place operation, for the deposition of adhesion layer 200a. Mask 202 blocks adhesion layer 200a from being formed on the surface of package 140b within interconnect area 142b. Shielded area 142a is covered in adhesion layer 200a but the adhesion layer is formed on mask 202 instead of the surface of package 140b within interconnect area 142b. Mask 202 is removed, typically using the same pick-and-place operation that placed the mask, which removes the portion of adhesion layer 200a formed on the mask.

In FIG. 4b, shielding layer 200b is formed without mask 202. Without a mask, shielding layer 200b fully covers all of package 140b as illustrated above with shielding layer 180. Shielding layer 200b is generally formed of copper, which is a desired material for conductive traces and contact pads in general. Therefore, shielding layer 200b is formed over interconnect area 142b for use in making interconnect structures 190.

Figures 4C, 4D:
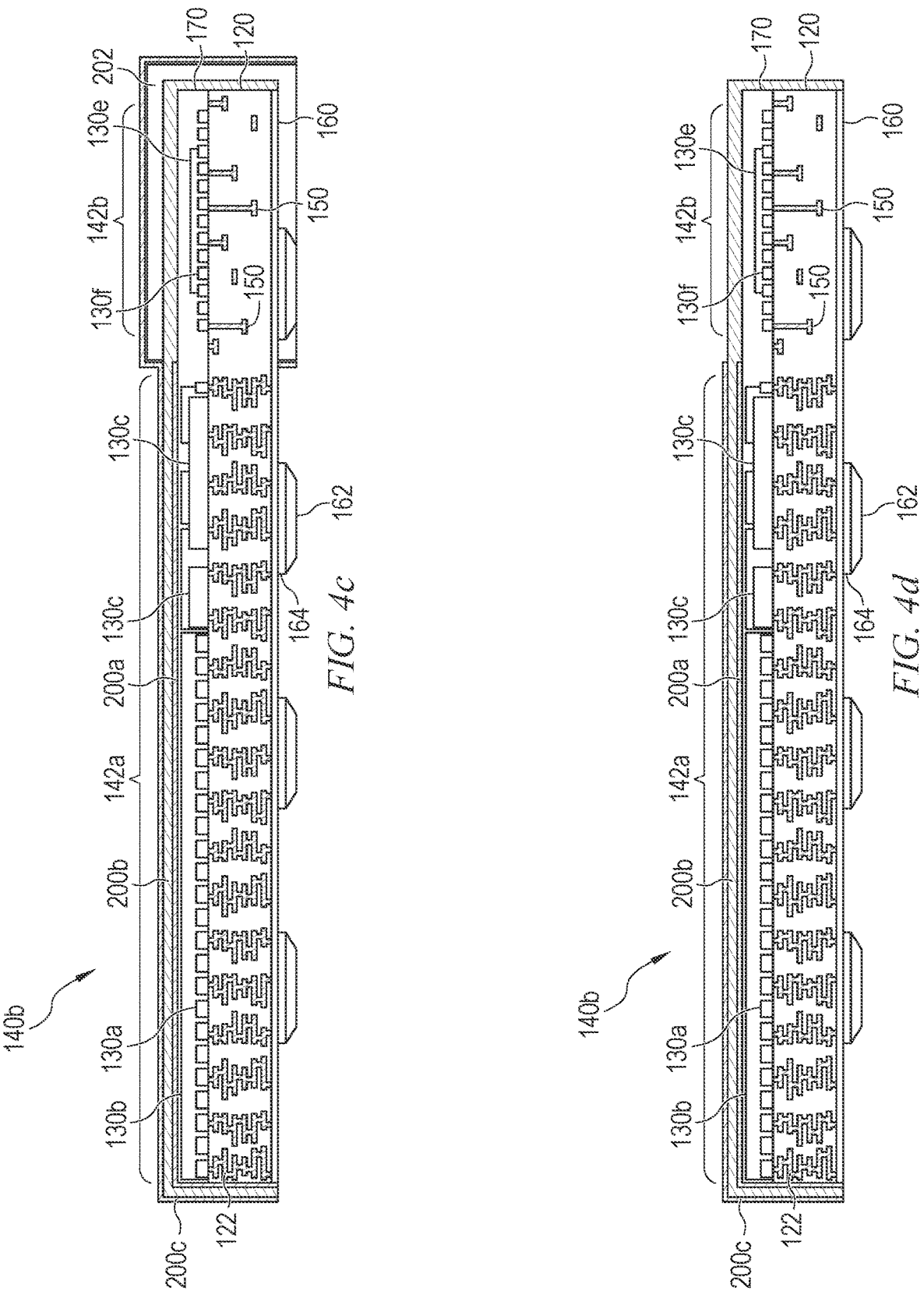

Protection layer 200c is formed with mask 202 again disposed over interconnect area 142b in FIG. 4c. Mask 202 can be the same mask in FIG. 4c as was used in FIG. 4a, or another mask. Mask 202 can be reused multiple times with multiple packages indefinitely, using the same pick-and-place process, until the mask begins to deteriorate or show physical damage. Mask 202 blocks protection layer 200c from being formed directly on semiconductor package 140b within interconnect area 142b.

When mask 202 is removed in FIG. 4*d*, a shielding layer with three layers 200*a*-200*c* is formed over shielded area 142*a* while only the copper shielding layer 200*b* is formed over interconnect area 142*b*. Manufacturing proceeds as shown above in FIGS. 2*n*-2*r*, and interconnect structures 190 are formed as pure copper conductive traces rather than having multiple layers as with the shielding layer of the same package 140*b*. Having only shielding layer 200*b* for interconnect structures 190 improves performance of the electrical connection between B2B connector 196 and substrate 120 while having three shielding layers 200*a*-200*c* for the shielding layer improves EMI protection for shielded area 142*a*.

Any of the shielding layers 200*a*-200*c* can be formed using any of the processes and materials discussed above for shielding layer 180. Other than the steps of forming shielding layers 200*a*-200*c* shown in FIGS. 4*a*-4*d*, manufacturing of semiconductor package 140*c* proceeds as illustrated in FIGS. 2*a*-2*r* for semiconductor package 140.

Figure 5:
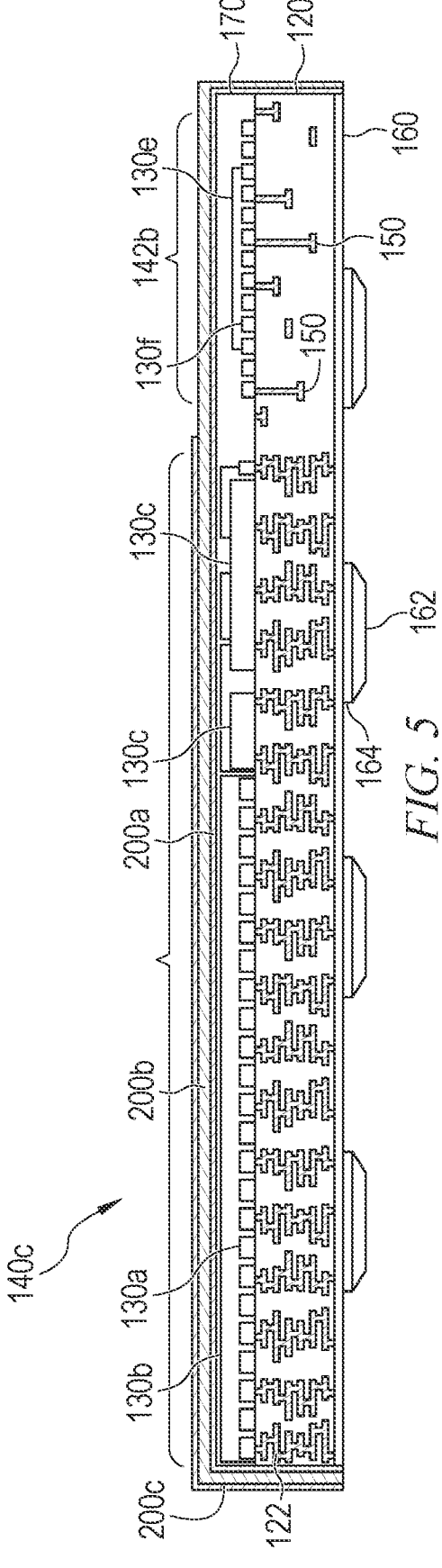
FIG. 5 illustrates another multi-layered shielding layer embodiment.

FIG. 5 shows a similar embodiment, but semiconductor package 140*c* has both adhesion layer 200*a* and shielding layer 200*b* formed over interconnect area 142*b*. Adhesion layer 200*a* formed between interconnect structures 150 and the copper traces to be formed out of shielding layer 200*b* helps with reliability of the interconnects over time in some embodiments. Adhesion layer 200*a* reduces peeling and other defects that may occur if only shielding layer 200*b* is used. Again, manufacturing proceeds as shown above in FIGS. 2*a*-2*r* except for the formation of three shielding layers 200*a*-200*c*. Shielding layers 200*b* and 200*c* are formed over interconnect area 142*b*, by depositing the material without a mask, and patterned into interconnect structures 190. A mask is used when depositing protection layer 200*c* so the protection layer is only formed within shielding area 142*a*. B2B connector 196 is disposed over interconnect area 142*b*.

Figure 6:
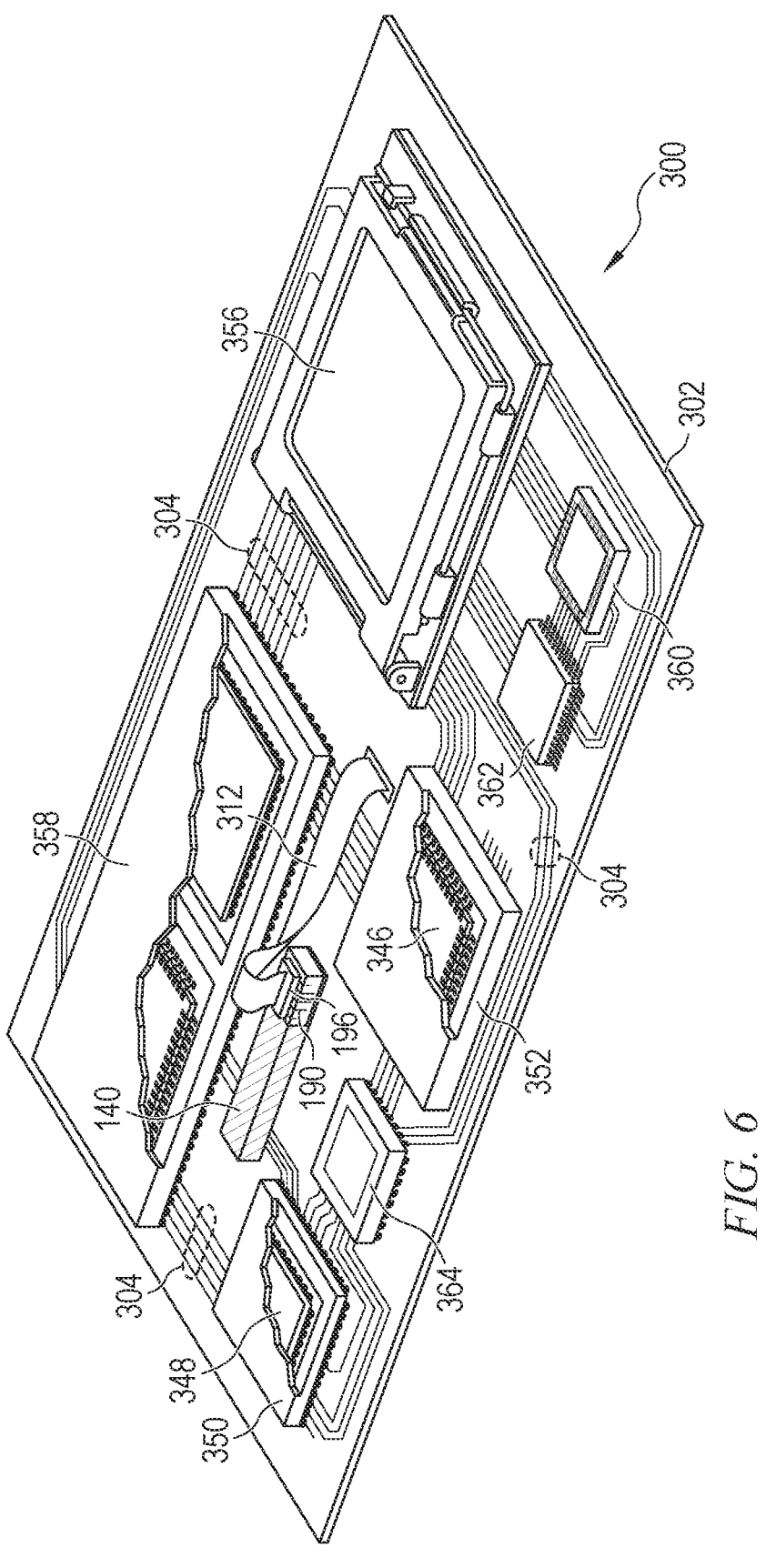
FIG. 6 illustrates an electronic device with different types of packages disposed on a printed circuit board (PCB).

FIG. 6 illustrates integrating the above-described semiconductor packages, e.g., semiconductor package 140, into a larger electronic device 300. Electronic device 300 includes PCB 302 with a plurality of semiconductor packages mounted on a surface of the PCB, including semiconductor package 140. In one embodiment, electronic device 300 is a mobile phone and PCB 302 is the main board or sub assembly of the phone. Semiconductor package 140 is mounted using a liquid adhesive, adhesive tape, or other suitable means to attach the package to substrate 302. Adhesive surrounds and grips onto blocks 162 in embodiments where the blocks are used. A ribbon cable 312 has a connector that snaps into B2B connector 196. Ribbon cable 312 routes electrical signals through to another B2B connector on substrate 302 or to another package mounted to the substrate. Electrical components 130 are electrically coupled to PCB 302 through substrate 120, interconnect structures 190, B2B connector 196, and ribbon cable 312.

Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 6, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with semiconductor package 140. Conductive traces 304 electrically couple the various packages and components disposed on PCB 302 to semiconductor package 140, giving use of electrical components 130 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
 a substrate including a portion of a conductive layer exposed at a side surface of the substrate;
 a first electrical component disposed over the substrate;
 an encapsulant deposited over the first electrical component;
 a shielding layer formed over a top surface of the encapsulant and a side surface of the encapsulant, wherein the shielding layer is patterned over the top surface of the encapsulant and the side surface of the encapsulant to form, a conductive trace that extends from the top surface of the encapsulant to the side surface of the encapsulant, a portion of the shielding layer at a first end of the conductive trace on the side surface of the encapsulant patterned to match a shape of the portion of the conductive layer of the substrate exposed at the side surface of the substrate, wherein the portion of the shielding layer is formed directly on the portion of the conductive layer over the substrate, and a contact pad at a second end of the conductive trace on the top surface of the encapsulant; and a B2B connector disposed over the encapsulant and electrically coupled to the substrate by the conductive trace.

2. The semiconductor device of claim 1, wherein the first electrical component is disposed under the B2B connector.

3. The semiconductor device of claim 2, further including a second electrical component disposed over the substrate, wherein the shielding layer remains unpatterned over the second electrical component.

4. The semiconductor device of claim 1, wherein the shielding layer is formed with a first number of layers in a first area over the top surface of the encapsulant and the side surface of the encapsulant and a second number of layers less than the first number of layers in a second area over the top surface of the encapsulant and the side surface of the encapsulant, and wherein the shielding layer is patterned to form the conductive trace and contact pad in the second area.

5. The semiconductor device of claim 1, wherein the encapsulant is molded to include a stepped top surface.

6. A semiconductor device, comprising:

a substrate;

an encapsulant deposited over the substrate;

a shielding layer formed over the encapsulant, wherein the shielding layer is patterned on a top surface of the encapsulant and a side surface of the encapsulant to form a conductive trace extending from the top surface of the encapsulant to the side surface of the encapsulant; and a first electrical component disposed over the encapsulant and electrically coupled to the substrate by the conductive trace.

7. The semiconductor device of claim 6, further including a second electrical component disposed in the encapsulant under the first electrical component.

8. The semiconductor device of claim 6, further including a second electrical component disposed in the encapsulant, wherein the shielding layer remains unpatterned over the second electrical component.

9. The semiconductor device of claim 6, wherein the shielding layer is formed with a first number of layers in a first area and a second number of layers less than the first number of layers in a second area, and wherein the shielding layer is patterned to form the conductive trace in the second area.

10. The semiconductor device of claim 6, wherein the conductive trace extends to a conductive layer of the substrate.

11. The semiconductor device of claim 6, wherein the encapsulant is molded to include a stepped top surface.

12. The semiconductor device of claim 11, wherein a top surface of the encapsulant in a first area is at a greater height above the substrate than a top surface of the first electrical component.

13. A method of making a semiconductor device, comprising:

providing a substrate including a portion of a conductive layer exposed at a side surface of the substrate;

disposing a first electrical component over the substrate;

depositing an encapsulant over the first electrical component;

forming a shielding layer over a top surface of the encapsulant and a side surface of the encapsulant;

patterning the shielding layer over the top surface of the encapsulant and the side surface of the encapsulant to form, a conductive trace that extends from the top surface of the encapsulant to the side surface of the encapsulant, a portion of the shielding layer at a first end of the conductive trace on the side surface of the encapsulant patterned to match a shape of the portion of the conductive layer of the substrate exposed at the side surface of the substrate, wherein the portion of the shielding layer is formed directly on the portion of the conductive layer over the substrate, and a contact pad at a second end of the conductive trace on the top surface of the encapsulant; and disposing a B2B connector over the encapsulant and electrically coupled to the substrate by the conductive trace.

14. The method of claim 13, further including disposing the B2B connector over the first electrical component.

15. The method of claim 14, further including disposing a second electrical component over the substrate, wherein the shielding layer remains unpatterned over the second electrical component after patterning the shielding layer to form the conductive trace and contact pad.

16. The method of claim 13, further including:

forming the shielding layer as a plurality of conductive layers, wherein a mask is disposed over a first area of the encapsulant while forming one or more of the conductive layers; and patterning the shielding layer to form the conductive trace and contact pad in the first area.

17. The method of claim 13, further including molding the encapsulant to include a stepped top surface.

18. A method of making a semiconductor device, comprising:

providing a substrate;

depositing an encapsulant over the substrate;

forming a shielding layer over the encapsulant;

patterning the shielding layer on a top surface of the encapsulant and a side surface of the encapsulant to form a conductive trace extending from the top surface of the encapsulant to the side surface of the encapsulant; and disposing a first electrical component over the encapsulant and electrically coupled to the substrate by the conductive trace.

19. The method of claim 18, further including:

disposing a second electrical component over the substrate;

depositing the encapsulant over the second electrical component; and disposing the first electrical component over the second electrical component.

20. The method of claim 18, further including:

disposing a second electrical component over the substrate;

depositing the encapsulant over the second electrical component; and forming the shielding layer over the second electrical component, wherein the shielding layer remains unpatterned over the second electrical component after patterning the shielding layer to form the conductive trace.

21. The method of claim 18, further including:

forming the shielding layer as a plurality of conductive layers, wherein a mask is disposed over a first area of the encapsulant while forming one or more of the conductive layers; and patterning the shielding layer to form the conductive trace in the first area.

22. The method of claim 18, further including molding the encapsulant to include a stepped top surface.

\* \* \* \* \*